(12) United States Patent
Liao et al.

(10) Patent No.: US 6,590,295 B1
(45) Date of Patent: Jul. 8, 2003

(54) MICROELECTRONIC DEVICE WITH A SPACER REDISTRIBUTION LAYER VIA AND METHOD OF MAKING THE SAME

(75) Inventors: Hung-Che Liao, Tainan (TW); Chin-Kang Lee, Tainan (TW); Tao-Sheng Chang, Tainan (TW); Feng-Ru Chang, Tainan (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/167,612

(22) Filed: Jun. 11, 2002

(51) Int. Cl.[7] .................. H01L 23/48; H01L 23/52; H01L 29/40
(52) U.S. Cl. .................. 257/781; 257/758; 257/780
(58) Field of Search ................ 257/780, 781, 257/758, 774

(56) References Cited

U.S. PATENT DOCUMENTS

| | | | |
|---|---|---|---|
| 4,962,414 A | * | 10/1990 | Liou et al. |
| 5,414,302 A | * | 5/1995 | Shin et al. |
| 6,339,257 B1 | * | 1/2002 | Fujiki et al. |
| 6,414,395 B1 | * | 7/2002 | Ookuma et al. |

* cited by examiner

Primary Examiner—Sheila V. Clark
(74) Attorney, Agent, or Firm—Tung & Associates

(57) ABSTRACT

A microelectronic device including a substrate having a top metal layer, a first passivation layer overlying the substrate and wherein the passivation layer includes a via defined at least in part by a side wall of the passivation layer, and wherein the via overlies the top metal layer, a dielectric spacer positioned the via and the spacer having and inner wall with arcuate shape, an the electrically conductive redistribution layer having a portion positioned overlying the inner wall of the spacer and wherein the redistribution layer includes a portion in electrical contact with the top metal layer.

10 Claims, 5 Drawing Sheets

MICROELECTRONIC DEVICE WITH A SPACER REDISTRIBUTION LAYER VIA AND METHOD OF MAKING THE SAME

FIELD OF THE INVENTION

This invention relates to microelectronic devices, and more particularly, to a microelectronic device, such as a wafer level chip scale package, having a spacer retribution layer via and a method of making the same.

BACKGROUND OF THE INVENTION

It is known to make semiconductor devices using a redistribution layer to connect a bond pad and a solder bump that are laterally spaced apart. One such device is a wafer level chip scale package (WLCSP). From a manufacturing point of view, a WLCSP is just an improved version of a traditional solder-bumped flip chip, except that the solder bumps on a WLCSP are much larger, the printed circuit board assembly of a WLCSP is more robust, and the manufacture usually does not have to struggle with an underfill encapsulant. WLCSP and flip chip manufacture share common components and techniques, particularly solder bumping. A brief discussion of flip chip technology will be helpful in understanding the present invention which primarily relates to semiconductor devices having a redistribution layer connected to a solder bump such as WLCSP.

A flip chip microelectronic assembly includes a direct electrical connection of face down (that is, "flipped") electronic components onto substrates, such as ceramic substrates, circuit boards, or carriers using conductive bump bond pads of the chip. Flip chip technology is quickly replacing older wire bonding technology that uses face up chips with a wire connected to each pad on the chip.

The flip chip components used in flip chip microelectronic assemblies are predominantly semiconductor devices, however, components such as passive filters, detector arrays, and MEM devices are also being used in flip chip form. Flip chips are also known as "direct chip attach" because the chip is directly attached to the substrate, board, or carrier by the conductive bumps.

The use a flip chip packaging has dramatically grown as a result of the flip chip's advantages in size, performance, flexibility, reliability, and cost over other packaging methods and from the widening availability of flip chip materials, equipment and services. In some cases, the elimination of old technology packages and bond wires may reduce the substrate or board area needed to secure the device by up to 25 percent, and may require far less height. Further, the weight of the flip chip can be less than 5 percent of the old technology package devices.

Flip chips are advantageous because of their high-speed electrical performance when compared to other assembly methods. Eliminating bond wires reduces the delay in inductance and capacitance of the connection, and substantially shortens the current path resulting in a high speed off-chip interconnection.

Flip chips also provide the greatest input/output connection flexibility. Wire bond connections are generally limited to the perimeter of the chip or die, driving the die sizes up as a number of connections have increased over the years. Flip chip connections can use the whole area of the die, accommodating many more connections on a smaller die. Further, flip chips can be stacked in 3-D geometries over other flip chips or other components.

Flip chips also provided the most rugged mechanical interconnection. Flip chips when underfilled with an adhesive such as an epoxy, can withstand the most rugged durability testing. In addition to providing the most rugged mechanical interconnection, flip chips can be the lowest cost interconnection for high-volume automated production.

The bumps of the flip chip assembly serve several functions. The bumps provided an electrical conductive path from the chip (or die) to the substrate on which the chip is mounted. A thermally conductive path is also provided by the bumps to carry heat from the chip to the substrate. The bumps also provided part of the mechanical mounting of the chip to the substrate. A spacer is provided by the bumps that prevents electrical contact between the chip and the substrate connectors. Finally, the bumps act as a short lead to relieve mechanical strain between the chip and the substrate.

Flip chips are typically made by a process including placing solder bumps on a silicon wafer. The solder bump flip chip processing typically includes four sequential steps: 1) preparing the wafer for solder bumping; 2) forming or placing the solder bumps on the wafer; 3) attaching the solder bumped die to a board, substrate or carrier; and 4) completing the assembly with an adhesive underfill.

The first step in a typical solder bumping process involves preparing the semiconductor wafer bumping sites on bond pads of the individual integrated circuits defined in the semiconductor wafer. The preparation may include cleaning, removing insulating oxides, and preparing a pad metallurgy that will protect the integrated circuits while making good mechanical and electrical contact with the solder bump. Accordingly, protective metallurgy layers may be provided over the bond pad. Ball limiting metallurgy (BLM) or under bump metallurgy (UBM) generally consists of successive layers of metal. The "adhesion" layer must adhere well to both the bond pad metal and the surrounding passivation, provide a strong, low-stress mechanical and electrical connection. The "diffusion barrier" layer prevents the diffusion of solder into the underlying material. The "solder wettable" layer provides a wettable surface for the molten solder during the solder bumping process, for good bonding of the solder to the underlying metal.

A variety of UBM structures are known to those skilled in the art that accomplish the above functions and have one, two, three or more layers depending on whether the bump is gold, copper, aluminum, solder or nickel based. For gold based bumps, known UBM structure include layers of Cr—Cu, Ti—Pd, Ti—W, or Ti—Pt. For copper based bumps, known UBM structures include layers of Cr—Cu, or Al—Ni. For aluminum based bumps, known UBM structure include layers of Ti or Cr. For solder based bumps, known UBM structures include layers of Cr—Cu—Au, Ni—Cu, Ti—Cu, TiW—Cu, Ni—Au, or Al—NiV—Cu. For nickel based bumps, known UBM structure include layers of nickel. The UBM layers may be deposited by electroplating, evaporation, printing, electroless plating, and/or sputtering. It is also known to deposit one or more seed layers over the UBM structure prior to depositing the electrically conductive material (such as solder) that forms the bump.

In fabricating a flip-chip bond structure, the fabrication process requires a tight control of interface processes and manufacturing parameters in order to meet very small dimensional tolerances. Various techniques may be utilized to fabricate a UBM structure and to deposit the solder bump. A few widely used methods of depositing bumps include evaporation, electroplating, electroless plating and screen-printing. Kung et al, U.S. Pat. No. 6,179,200 provides a description of these more widely used methods of depositing bumps as follows.

The formation of solder bumps can be carried out by an evaporation method of Pb and Sn through a mask for producing the desired solder bumps. When a metal mask is used, UBM metals and solder materials can be evaporated through designated openings in the metal mask and be deposited as an array of pads onto the chip surface.

In one prior art evaporation method, a wafer is first passivated with an insulating layer such as $SiO_2$, via holes are then etched through the wafer passivation layer to provide a communication path between the chip and the outside circuit. After a molybdenum mask is aligned on the wafer, a direct current sputtering cleans the via openings formed in the passivation layer and removes undesirable oxides. A cleaned via opening assures low contact resistance and good adhesion to the $SiO_2$. A chromium layer is evaporated through a metal mask to form an array of round metal pads each covering an individual via to provide adhesion to the passivation layer and to form a solder reaction barrier to the aluminum pad underneath. A second layer of chromium/copper is then co-evaporated to provide resistance to multiple reflows. This is followed by a final UBM layer of pure copper which forms the solderable metallurgy. A thin layer of gold may optionally be evaporated to provide an oxidation protection layer. These metal-layered pads define the solder wettable regions on the chips, which are commonly referred to as the ball limiting metallurgy (BLM) or under bump metallurgy (UBM). After the completion of UBM, solder evaporation occurs through a metal mask, which has a hole diameter slightly greater than the UBM mask-hole diameter. This provides the necessary volume for forming a subsequent solder ball. A solder reflow process is performed at a temperature of about 350° C. to melt and homogenize the evaporated metal pad and to impart a truncated spherical shape to the solder bump. The evaporation method, even though well established and has been practiced for a long time in the industry, is a slow process and thus can not be run at a high throughput rate.

A second method for forming solder bumps is the electroplating method. In an electroplating process, UBM layers are first deposited, followed by the deposition of a photoresist layer, the patterning of the photoresist layer, and then the electro-deposition of a solder material into the photoresist openings. After the electro-deposition process is completed, the photoresist layer can be removed and the UBM layers can be etched by using the plated solder bumps as a mask. The solder bumps are then reflowed in a furnace reflow process. The photolithography/electroplating technique is a simpler technique than evaporation and is less expensive because only a single masking operation is required. However, electroplating requires the deposition of a thick and uniform solder over the entire wafer area and etching metal layers on the wafer without damaging the plated solder layer. The technique of electroless plating may also be used to form the UBM structure.

Another solder bump formation technique that is capable of solder-bumping a variety of substrates is a solder paste screening method. The screen printing technique can be used to cover the entire area of an 8-inch wafer. In this method, a wafer surface covered by a passivation layer with bond pads exposed is first provided. UBM layers are then deposited on top of the bond pads and the passivation layer. A photoresist layer is deposited over the UBM. The portions of the UBM are etched followed by stripping off the photoresist layer. A stencil is then aligned on the wafer and solder paste is squeegeed through the stencil to fill the openings on top of the bond pads and the UBM layers. After the stencil is removed, the solder bumps may be reflowed in a furnace to form solder balls.

One drawback of the solder paste screen printing process is that, with the recent trend in the miniaturization of device dimensions and the reduction in bump to bump spacing (or pitch), the prior art solder paste screening techniques become impractical. For instance, one of the problems in applying solder paste screening technique to modern IC devices is the paste composition itself. A paste in generally composed of a flux and solder alloy particles. The consistency and uniformity of the solder paste composition becomes more difficult to control with a decreasing solder bump volume. A possible solution for this problem is the utilization of solder paste that contains extremely small and uniform solder particles. However, this can only be achieved at a very high cost penalty. Another problem is using the solder paste screening technique in modern high-density devices is the reduced pitch between bumps. Since there is a large reduction in volume from a paste to the resulting solder bump, the screen holes must be significantly larger in diameter than the final bumps. It is therefore generally desirable to form solder bumps that are reflown into solder balls with a larger height and a larger pitch between the balls.

Several other methods are known to those skilled in the art for producing solder bumps on a semiconductor device. One such method is called the solder jet printing method. The solder jet printer method is based upon piezoelectric demand mode ink jet printing technology and is capable of producing and placing molten solder droplets 25–125 micrometers in diameter at rates of up to 2000 per second. In demand mode ink jet printing systems, a volumetric change in the fluid is induced either by the displacement of piezoelectric material that is coupled to the fluid or by the formation of the vapor bubble in the ink caused by heating a resistive element. The volumetric change causes pressure transience to occur in the fluid, and these are directed so as to produce a drop that issues from an orifice. A droplet is created only when it is desired in demand mode systems. Demand mode ink jet printing produces droplets that are approximately equal to the orifice diameter of the droplet generator.

Another method for producing solder bumps is known as the micro-punching method. In the micro-punching method, solder tape is supplied from a spool and rolled up by a motor driven spool. A micro-punch is driven by an electric actuator and a displacement enlarging mechanism. A micro-punch and die set blanks a thin solder tape and forms a small cylindrical piece. A solder flux may be formed over the entire semiconductor wafer to be bumped and the solder pieces may be punched and placed directly onto the wafer.

One of the most cost-effective packaging techniques is known as direct chip attach wherein a solder bumped flip chip is directly attached to a printed circuit board. However, due to the thermal expansion mismatch between the silicon chip and the printed circuit board (made from an epoxy or fiberglass material), an underfill encapsulant is usually needed for solder joint reliability. Due to the underfill operation, the manufacturing costs is increased in the manufacturing throughput is often substantially reduced. Further, reworking an underfill flip chip on a printed circuit board is practically impossible.

Another drawback of direct chip attach type microelectronic packaging techniques has to do with the pitch and size of the pads on the peripheral-arrayed chip. For direct chip attached assemblies, the bond pads are very small and result in high demand on the underlying printed circuit board.

Wafer level chip scale packages provide advantages over direct chip attached assemblies. In a wafer level chip scale package, a metal layer is used to redistribute the very fine pitched peripheral arrayed pads on the chip to much larger pitch area arrayed pads located in the interior portion of the upper face of the chip where larger solder joints may be provided for connection to the printed circuit board. Thus, the demands on the printed circuit board are much more relaxed using the wafer level chip sale packages.

FIG. 1 illustrates a wafer level chip scale package 100 including a square chip 112, which may be for example, approximately 9,64 by 9,64 mm. The integrated circuit chip 112 includes a silicon base with discrete devices formed therein and metal interconnects overlying the discrete devices in a manner known to those skilled in the art. A plurality of peripheral-arrayed bond pads 114 are provided over the metal interconnects. For example, the bond pads 114 typically may have a size of about 0.1 mm. by 0.1 mm and may be positioned with respect to each other at a pitch of about 0.25 mm. A metal layer or electrically conductive redistribution traces 116 are deposited on top of the wafer to redistribute the fine-pitched peripheral-arrayed bond pads 114 to a much larger pitch area-arrayed pads in the interior of the chip onto which larger solder bump connections 118 are provided. For example, the solder bump connections 118 may be formed on a redistribution pads having a pitch of about 0.75 and a pad size of about 0.3 mm in diameter.

FIG. 2 illustrates a portion of a prior art semiconductor device 10 such as a high speed analog device. The semiconductor device 10 includes a silicon based wafer or substrate 12 that includes a silicon base (not separately shown) that includes background doping and selective doping to define discrete semiconductor devices or structures. The semiconductor device 10 may include a plurality of alternating dielectric and metal layers overlying the silicon base in a manner known to those skilled in the art. One of the metal layers may be a bond pad or top metal layer 14. A first passivation layer such as a silicon nitride layer 16 may overlying the plurality of alternating dielectric and metal layers. The high speed analog device requires a relatively thick dielectric layer 18 to reduce signal interference. A relatively thick (approximately 3μm thick) dielectric layer 18 may overlying the first passivation layer 16, and an opening or via may be formed through the relatively thick dielectric layer 18 and the first passivation layer 16 and positioned over the top metal layer 14. The via may be defined by at least one relatively straight vertical side wall 19 of the relatively thick dielectric layer 18. An electrically conductive redistribution layer 20 may be provided having a portion in electrical contact with the top metal layer 14 and having another portion in electrical contact with an electrically conductive bump 26 such as a solder bump. An under bump metallurgy 24 may be interposed between the solder bump 26 and the redistribution layer 20. However, because the dielectric layer 18 is relatively thick, the electrically conductive redistribution layer 20 includes a relatively thin portion 28 along the side wall 19 of the dielectric layer 18. The relatively thin portion 28 of the electrically conductive redistribution layer 20 is prone to failure. Thus there is a need for semiconductor devices with reliable electrically conductive redistribution layers and methods of making the same. The present invention satisfies this need in the prior art.

SUMMARY OF THE INVENTION

One embodiment of the invention includes a microelectronic device having a substrate with a top layer, a passivation layer overlying the substrate and wherein the passivation layer includes a via defined at least in part by a side wall of the passivation layer, and wherein the via overlies the top metal layer, a dielectric spacer positioned in the via and the spacer having an inner wall with an arcuate shape, and an electrically conductive redistribution layer having a portion positioned overlying the inner wall of the spacer and wherein the redistribution layer includes a portion in electrical contact with the top metal layer.

Another embodiment of the invention includes a microelectronic device further including an electrically conductive bump overlying a portion of the electrically conductive redistribution layer and in electrical communication therewith.

Another embodiment of the invention includes a microelectronic device wherein the electrically conductive bump and the top metal layer are laterally spaced apart.

Another embodiment of the invention includes an under bump metallurgy interposed between the electrically conductive bump and electrically conductive redistribution layer.

In another embodiment of the invention the electrically conductive redistribution layer includes aluminum.

In another embodiment of the invention the electrically conductive redistribution layer includes copper.

In another embodiment of the invention the electrically conductive redistribution layer includes aluminum and copper.

In another embodiment of the invention the electrically conductive bump includes solder.

In another embodiment of the invention the spacer include silicon dioxide.

In another embodiment of the invention the substrate includes a semiconductor wafer.

In another embodiment of the invention includes a method of making a microelectronic device including providing a substrate having a top metal layer and providing a first passivation layer overlying a portion of the substrate and having an opening therein aligned with a portion of the top metal layer, depositing a dielectric layer over the first passivation layer and forming a via in the dielectric layer aligned with a portion of the top metal layer, wherein the via is defined at least in part by a side wall of the dielectric layer, depositing a conformal layer over at least a portion of the dielectric layer and into the via along the side wall of the passivation layer and over the top metal layer, and removing portions of the conformal layer to leave a spacer in the via, and wherein the spacer includes an arcuate shaped inner wall, and depositing electrically conductive redistribution layer over a portion of the dielectric layer, over the inner wall of the spacer and overlying the top metal layer so that the electrically conductive redistribution layer is in electrical contact with the top metal layer.

Another embodiment of the invention further includes depositing a second passivation layer over the electrically conductive redistribution layer and forming an opening therein overlying a portion of the electrically conductive redistribution layer.

Another embodiment of the invention further includes depositing an under bump metallurgy over the second passivation layer and into the opening in the second passivation layer and overlying a portion of the electrically conductive redistribution layer.

Another embodiment of the invention further includes depositing an electrically conductive material over the under bump metallurgy and aligned with the opening in the passivation layer to provide a pre-bump structure.

In another embodiment of the invention further includes removing excess under bump metallurgy using the pre-bump structures as a mask.

Another embodiment of the invention further includes heating the pre-bump structure to reflow the same and forming an electrically conductive bump in electrical contact with the electrically conductive redistribution layer.

Another embodiment of the invention the electrically conductive material deposited to providing the pre-bump structure comprises solder.

In another embodiment of the invention the conformal layer comprises silicon dioxide.

In another embodiment of the invention the depositing of the conformal layer includes depositing silicon dioxide using chemical vapor deposition.

In another embodiment of the invention the silicon dioxide is formed by chemical vapor deposition using TEOS.

In another embodiment of the invention the removing the portions of the conformal layer includes isotopic etching of the conformal layer to provide the spacer with the arcuate shape side wall and an opening down to the top metal layer.

In another method embodiment of the invention the substrate includes a semiconductor wafer.

These and other objects, features and advantages of the present invention will become apparent from the following brief description of the drawings, detailed description of the preferred embodiments, and appended claims and drawings.

DETAILED DESCRIPTION OF THE PREFERRED EMBODIMENTS

Figure 1:
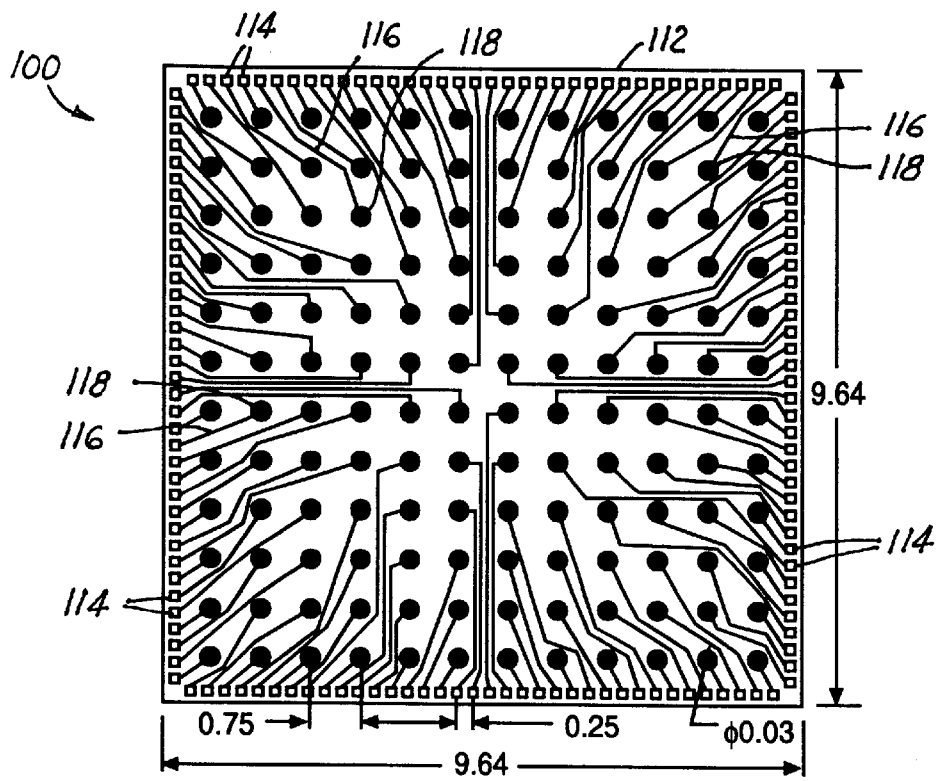
FIG. 1 illustrates a prior art wafer chip scale package.
Figure 2:
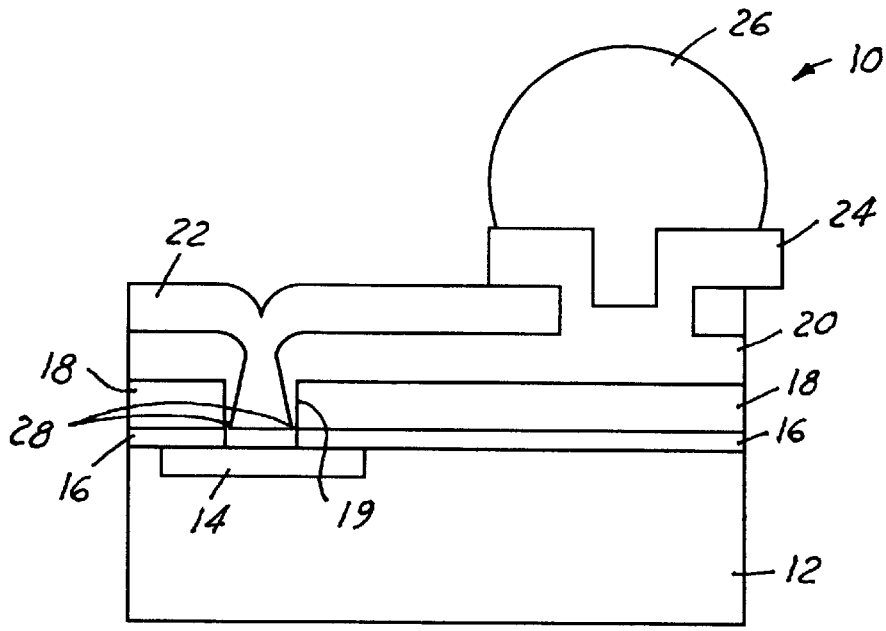
FIG. 2 illustrates a prior art semiconductor device.
Figure 3:
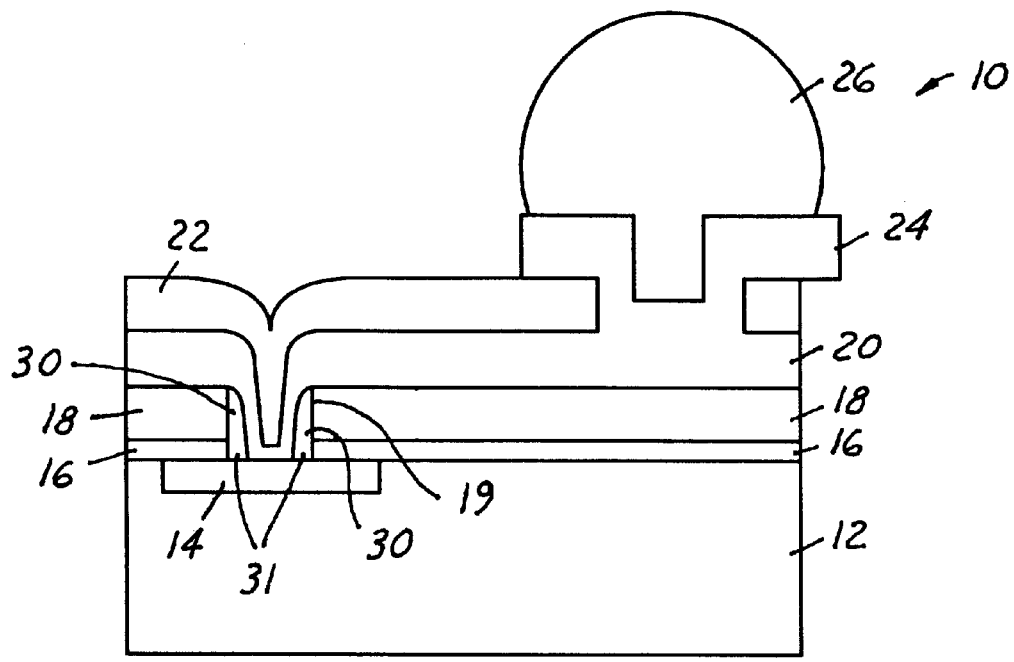
FIG. 3 illustrates a semiconductor device having a spacer via structure according the present invention.

FIG. 3 illustrates one embodiment of the present invention that includes a portion of a semiconductor device 10 such as a high speed analog device . The semiconductor device 10 includes a silicon based wafer or substrate 12 that includes a silicon base (not separately shown) that includes background doping and selective doping to define discrete semiconductor devices or structures. The semiconductor device 10 may include a plurality of alternating dielectric and metal layers overlying the silicon base in a manner known to those skilled in the art. One of the metal layers may be a bond pad or top metal layer 14. A first passivation layer such as a silicon nitride layer 16 may overlie the plurality of alternating dielectric and metal layers. The high speed analog device requires a relatively thick dielectric layer 18 to reduce signal interference. A relatively thick (approximately $3\mu m$ thick) dielectric layer 18 may overlie the first passivation layer 16, and an opening or via may be formed through the relatively thick dielectric layer 18 and the first passivation layer 16 and positioned over the top metal layer 14. The via may be defined by at least one relatively straight vertical side wall 19 of the relatively thick dielectric layer 18. According to the present invention a spacer 30 is provided in the via that is defined by the straight vertical side wall 19 of the relatively thick dielectric layer 18. The spacer 30 includes at least one inner wall having an arcuate shape. Preferably the spacer 30 is made from a conformal material that is deposited into the via and portions selectively removed to in any manner known to those skilled in the art, and by way of illustration will be described hereafter. Preferably the spacer 30 is provided by chemical vapor deposition of silicon dioxide, for example by using tetraorthosilicate (TEOS). An electrically conductive redistribution layer 20 may be provided having a portion in electrical contact with the top metal layer 14 and having another portion in electrical contact with an electrically conductive bump 26, such as a solder bump. An under bump metallurgy 24 may be interposed between the solder bump 26 and the redistribution layer 20. For solder based bumps, known UBM structures include layers of Cr—Cu—Au, Ni—Cu, Ti—Cu, TiW—Cu, Ni—Au, or Al—NiV—Cu. Because the spacer 30 includes an arcuate shaped inner wall 31 the redistribution layer 20 is substantially thick throughout and is not prone to failure as are the prior art devices.

Figure 4A:
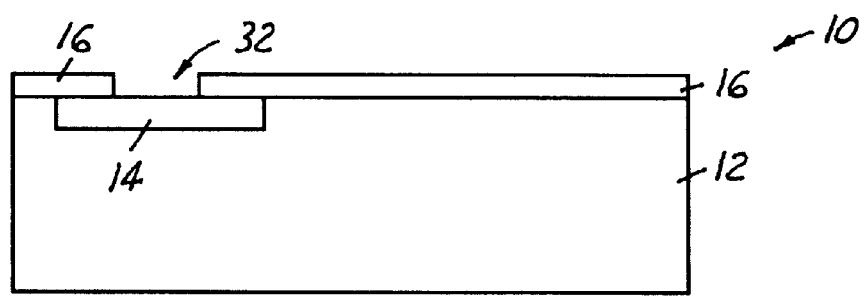
FIG. 4A in illustrates a method including providing a semiconductor wafer having a silicon based substrate, a top metal layer and a first passivation layer according to the present invention.
Figure 4B:
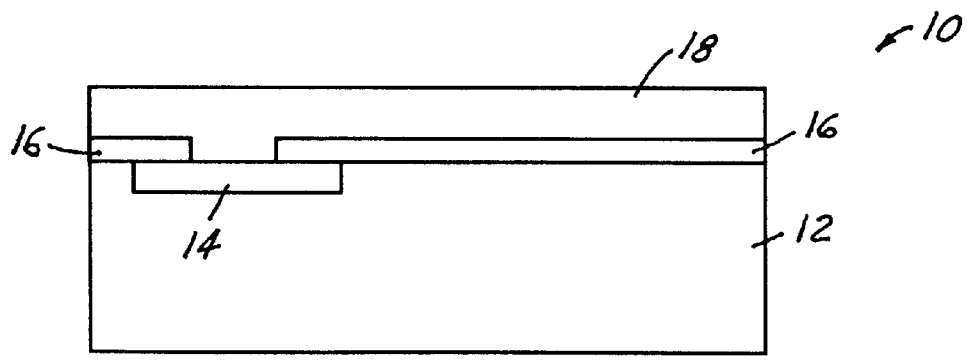
FIG. 4B illustrates a method including depositing a relatively thick dielectric layer over the structure illustrated in FIG. 4A according to the present invention.

FIGS. 4A-L illustrate a method of making a semiconductor device according to the present invention. As shown in FIG. 4A a semiconductor device 10 is provided having a silicon base 12 and a plurality of alternating dielectric and metal layers (not separately shown) and including a top metal layer (or bond pad) 14. A first passivation layer 16 is provided over the silicon base 12 and includes an opening 32 therein overlying the top metal layer 14. Preferably the first passivation layer 16 is a silicon nitride based material. As shown in FIG. 4B a relatively thick dielectric layer 18, preferably at least 3μm thick, is provided over the first passivation layer 16. The relatively thick dielectric layer 18 may be provided by any of a variety of methods known to those skilled in art.

Figure 4C:
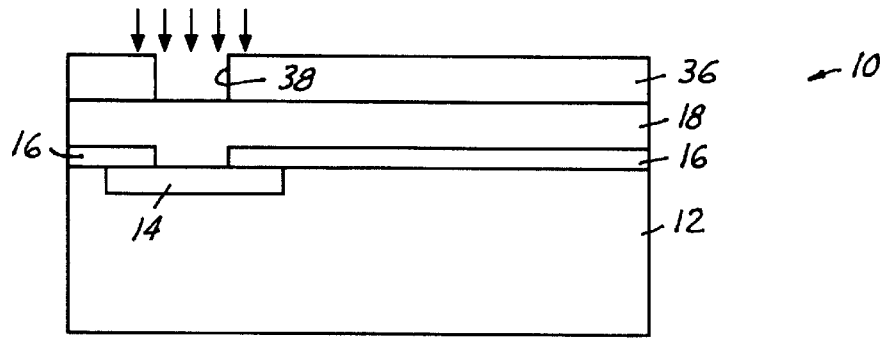
FIG. 4C illustrates the depositing a sacrificial layer over the relatively thick dielectric layer and etching the dielectric layer through an opening in sacrificial layer according to the present invention.
Figure 4D:
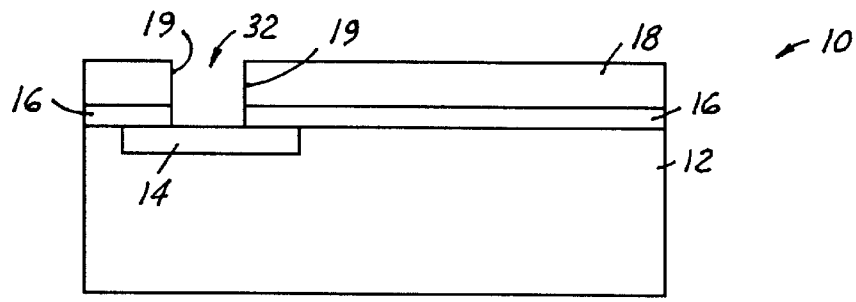
FIG. 4D illustrates a method including providing a semiconductor device of FIG. 4C wherein a via has been etched in the dielectric layer according to the present invention.
Figure 4E:
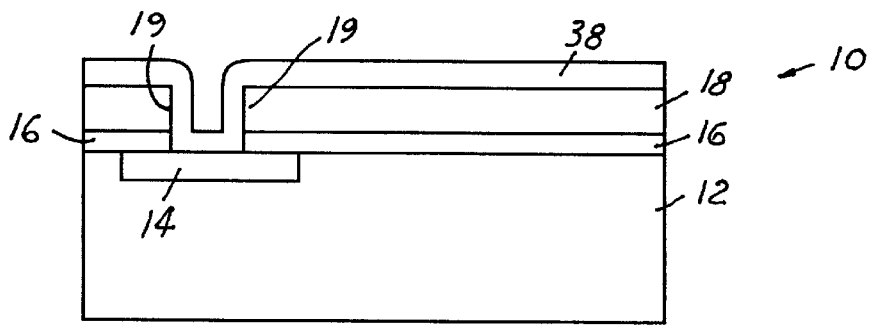
FIG. 4E illustrates depositing a conformal layer over the dielectric layer and into the via defined at least in part by the dielectric layer according to the present invention.

Thereafter, as illustrated in FIG. 4C, a sacrificial layer 36, such as a photoresist layer, may be deposited, and if necessary patterned and developed to provide an opening 38 therein registered with the opening in the first passivation layer 16 and with the top metal layer 14. An opening is etched through the relatively thick dielectric layer 18 to provide a via 32 through the relatively thick dielectric layer 18, the first passivation layer 16 and down to the top metal layer 14. Preferably the relatively thick dielectric layer 18 is etched using an isotropic method (for example using a CHF₃ plasma etch) so that at least one relatively straight side wall 19 is provided in the relatively thick dielectric layer 18 that defines the via 32. The sacrificial layer 36 is removed by etching or other methods known to those skilled in the art. As shown in FIG. 4E, a conformal layer 38 is deposited over the wafer, the side wall 19 and down into the via 32 and over the top metal layer 14. Preferably the conformal layer 38 includes silicon dioxide deposited by a chemical vapor deposition process utilizing TEOS so that the conformal material has relatively uniform thickness. Preferably the average thickness of the conformal layer 38 is about 500–5000 Å (angstroms).

Figure 4F:
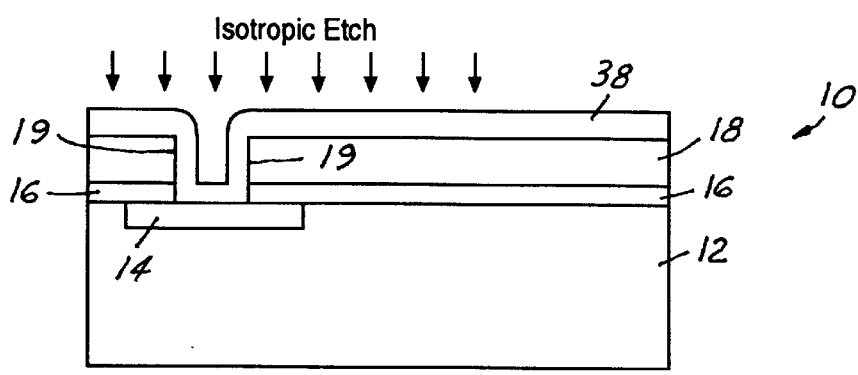
FIG. 4F illustrates removing portions of the conformal layer by isotopic etching according to the present invention.
Figure 4G:
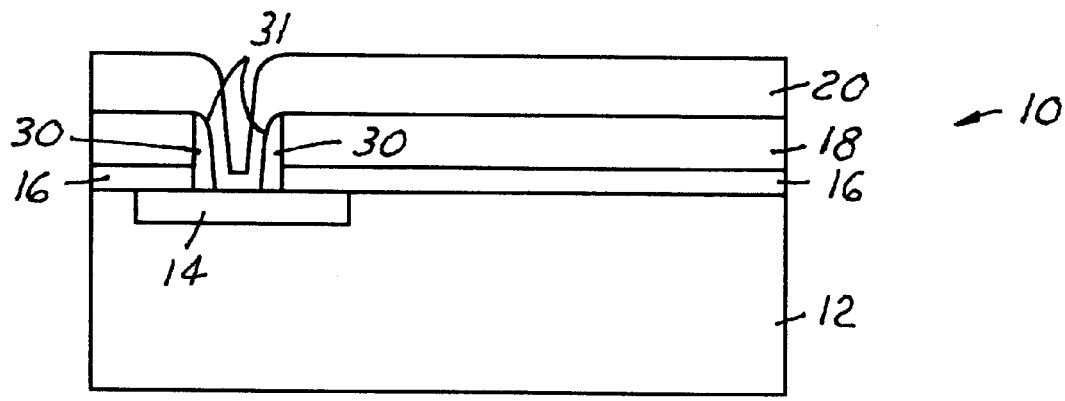
FIG. 4G illustrates a method including depositing electrically conductive redistribution layer over the dielectric layer and over a spacer formed in the via in the dielectric layer according to the present invention.

As shown in FIG. 4F, the conformal material 38 is selectively removed, for example by using an isotropic etch such as a wet HF buffered etch to provide a dielectric spacer 30 in the via 32 as shown in FIG. 4G. Preferably the dielectric spacer 30 includes an inner sidewall 31 that has an arcuate shape. An electrically conductive redistribution layer 20 is deposited over the wafer and into the via 32 and over the arcuate shaped inside wall 31 of the spacer 30 as shown in FIG. 4G. Because the spacer 30 has an arcuate shaped inside wall 31, the redistribution layer 20 is deposited relatively uniformly over the wafer and down into the via 32 and so that the redistribution layer 20 does not include any relatively narrow portions that are prone to failure as was the case in the prior art devices. The redistribution layer 20 may be deposited by any of a variety of methods including, but not limited to, screen printing, electroplating, electroless plating or the like. The electrically conductive redistribution layer 20 may be made from any of a variety of materials but preferably includes aluminum and copper.

Figure 4H:
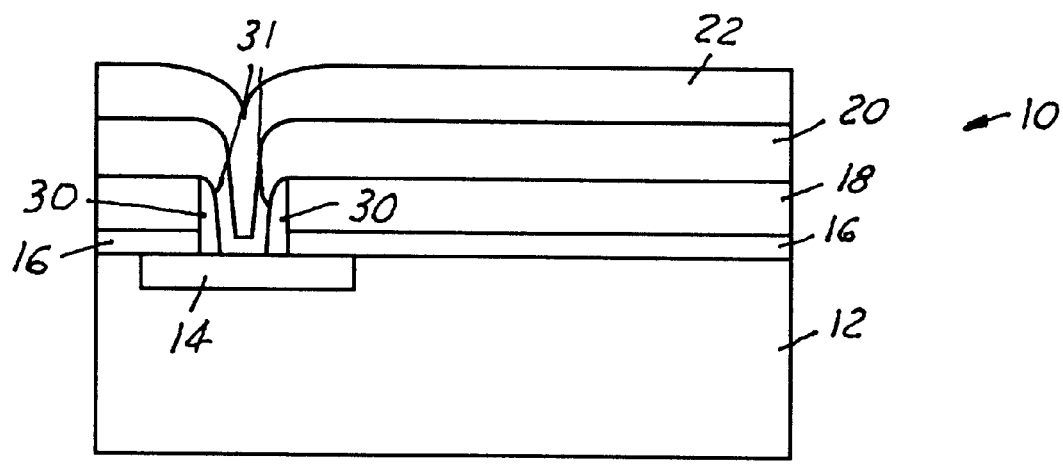
FIG. 4H illustrates a method including depositing a second passivation layer over the electrically conductive redistribution layer of FIG. 4G according to the present invention.
Figure 4I:
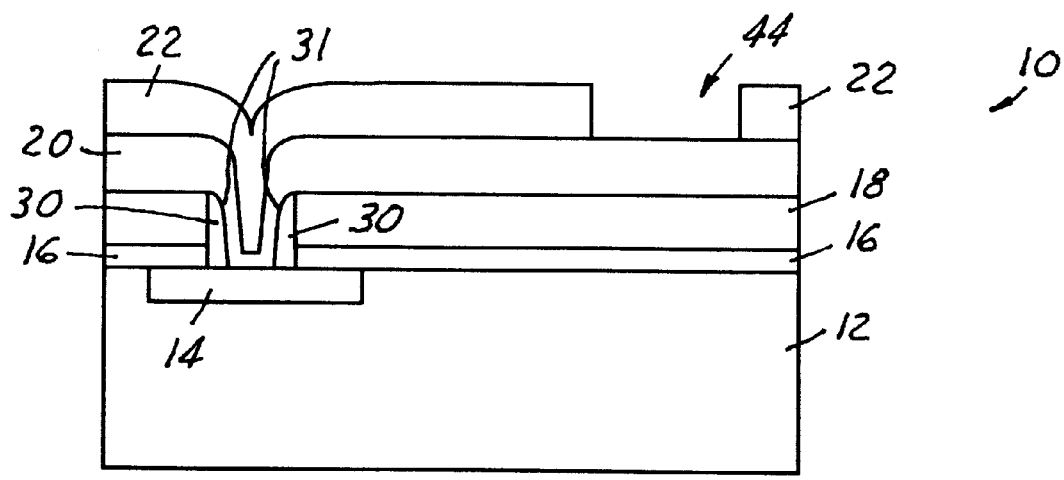
FIG. 4I illustrates forming an opening in the second passivation layer overlying a portion of the electrically conductive redistribution layer according to the present invention.
Figure 4J:
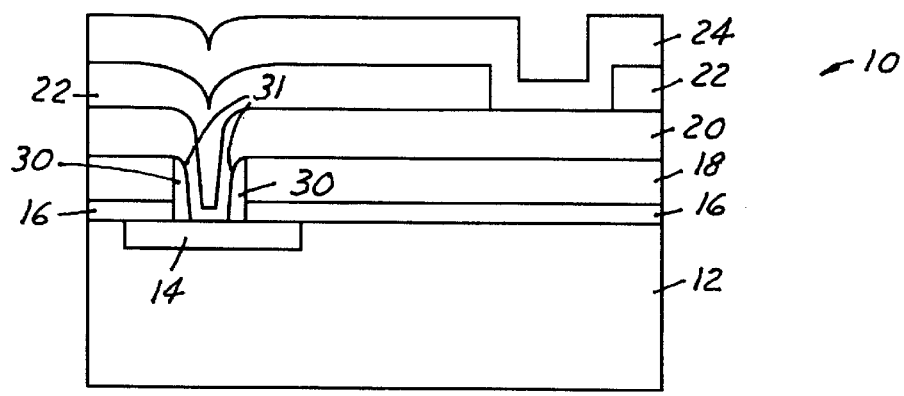
FIG. 4J illustrates the step of depositing an under bump metallurgy over the passivation layer and down into the opening therein and overlying a portion of the electrically conductive redistribution layer according to the present invention.
Figure 4K:
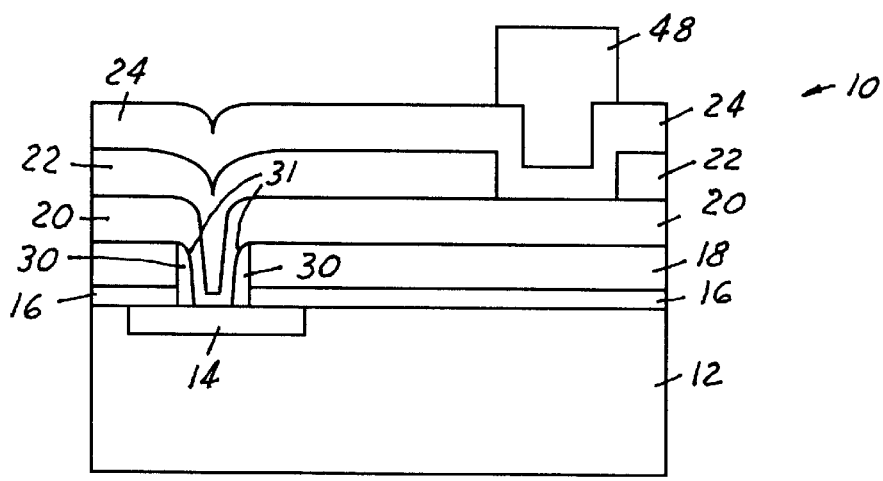
FIG. 4K illustrates a method including depositing a pre-bump structure over the under bump metallurgy and aligned with the opening in the second passivation layer according to the present invention.

A shown in FIG. 4H, thereafter a second passivation layer 22 is deposited over the electrically conductive redistribution layer 20. An opening 44 is formed in the second passivation layer 22 down to the electrically conductive redistribution layer 20 as shown in FIG. 4I. An under bump metallurgy 24 is deposited over the semiconductor wafer and down into the opening in the second passivation layer 22 to make electrical contact with the electrically conductive redistribution layer 20.

Figure 4L:
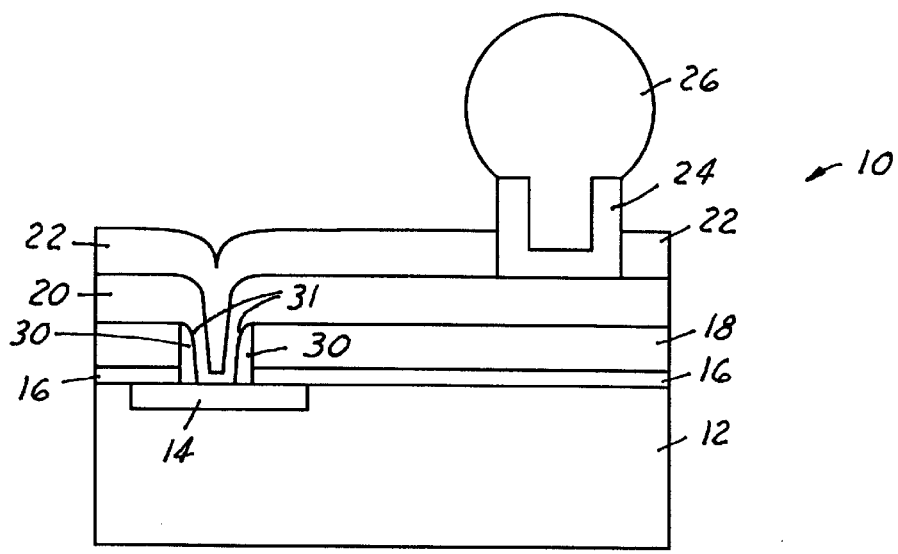
FIG. 4L illustrates a method including removing excess under bump metallurgy and heating the pre-bump structure to form an electrically conductive bump in electrical contact with the electrically conductive redistribution layer according to the present invention.

The under bump metallurgy 24 may be deposited by any of a variety of methods including those described in the background of the invention including, but not limited to electroplating, sputtering, screen printing. The under bump metallurgy 24 may have a variety layer and composition, such as those described in the background of the invention. A shown in FIG. 4K electrically conductive material is deposited over the under bump metallurgy 24 and aligned with the opening 44 formed in the second passivation layer 22 to provide an electrically conductive pre-bump structure 48. The electrically conductive material of the pre-bump structure 48 may be any material known to those skilled in the art for making electrically conductive bumps as described in the background of the invention, but preferably is a solder material. As shown in FIG. 4L, excess under bump metallurgy 24 may be removed by, for example, etching using the electrically conductive pre-bump structure 24 as a mask, and thereafter the electrically conductive pre-bump structure 48 is heated to reflow the same forming an electrically conductive bump 26 to provide a semiconductor device having a redistribution layer spacer 30 via structure according to the present invention.

What is claimed is:

1. A microelectronic device comprising:
a substrate having a top metal layer, a first passivation layer comprising silicon nitride overlying the substrate and wherein the passivation layer includes a via formed therein defined at least in part by at least one straight vertical side wall of the passivation layer, and wherein the via overlies the top metal layer, a dielectric spacer having at least a portion positioned in the via the dielectric spacer comprising a portion of a conformal layer separately deposited from the passivation layer and the spacer having an outer straight vertical wall adjacent the straight vertical wall of the spacer and an arcuate shaped inner wall positioned opposite the outer straight vertical wall of the spacer, and an electrically conductive redistribution layer having a portion positioned overlying the inner wall of the spacer and wherein the redistribution layer includes a portion in electrical contact with the top metal layer, and further comprising an electrically conductive bump overlying a portion of the electrically conductive redistribution layer and in electrical communication therewith.

2. A microelectronic device as set forth in claim 1 further comprising a dielectric layer overlying the first passivation layer and having a via formed therein aligned with the via in the passivation layer and defined at least in part by at least one straight vertical side wall and wherein the spacer includes a portion positioned in the via in the dielectric layer.

3. A microelectronic device as set forth in claim 1 wherein the electrically conductive bump and the top metal layer are laterally spaced apart.

4. A microelectronic device as set forth in claim 3 further comprising an under bump metallurgy interposed between the electrically conductive bump and the electrically conductive redistribution layer.

5. A microelectronic device as set forth in claim 1 wherein the electrically conductive redistribution layer comprises aluminum.

6. A microelectronic device as set forth in claim 1 wherein the electrically conductive redistribution layer comprises copper.

7. A microelectronic device as set forth in claim 1 further comprising a second passivation layer overlying the electrically conductive redistribution layer and having a portion extending into the via in the dielectric layer and the second passivation layer having an opening therein laterally spaced from the portion of the second passivation layer extending into the via in the dielectric layer.

8. A microelectronic device as set forth in claim 1 wherein the electrically conductive bump comprises solder.

9. A microelectronic device as set forth in claim 1 wherein the spacer comprises silicon dioxide.

10. A microelectronic device as set forth in claim 1 wherein the spacer comprises chemical vapor deposited silicon dioxide.

* * * * *